United States Patent
Kellerman et al.

(10) Patent No.: US 8,475,591 B2
(45) Date of Patent: Jul. 2, 2013

(54) METHOD OF CONTROLLING A THICKNESS OF A SHEET FORMED FROM A MELT

(75) Inventors: Peter L. Kellerman, Essex, MA (US); Fredrick Carlson, Potsdam, NY (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 965 days.

(21) Appl. No.: 12/539,125

(22) Filed: Aug. 11, 2009

(65) Prior Publication Data

US 2010/0038826 A1  Feb. 18, 2010

Related U.S. Application Data

(60) Provisional application No. 61/089,289, filed on Aug. 15, 2008.

(51) Int. Cl.
*C30B 15/20* (2006.01)

(52) U.S. Cl.
USPC ............. 117/26; 117/111; 117/114; 117/115; 117/116; 117/127

(58) Field of Classification Search
None
See application file for complete search history.

(56) References Cited

U.S. PATENT DOCUMENTS

| | | | |
|---|---|---|---|
| 3,430,680 A | 3/1969 | Leghorn | |
| 3,607,115 A | 9/1971 | Bleil | |
| 3,681,033 A | 8/1972 | Blyeil | |
| 3,759,671 A | 9/1973 | Bleil | |
| 4,121,965 A | 10/1978 | Leipold | |
| 4,226,834 A | 10/1980 | Shudo et al. | |
| 4,264,407 A | 4/1981 | Shudo et al. | |
| 4,289,571 A | 9/1981 | Jewett | |
| 4,316,764 A | 2/1982 | Kudo et al. | |
| 4,322,263 A | 3/1982 | Kudo et al. | |
| 4,329,195 A | 5/1982 | Kudo | |
| 4,417,944 A | 11/1983 | Jewett | |
| 4,428,783 A | 1/1984 | Gessert | |
| 4,447,289 A * | 5/1984 | Geissler et al. | 117/27 |
| 4,594,229 A | 6/1986 | Ciszek et al. | |
| 4,599,132 A * | 7/1986 | Jewett et al. | 117/27 |
| 4,599,244 A * | 7/1986 | Falckenberg et al. | 438/62 |

(Continued)

FOREIGN PATENT DOCUMENTS

| | | |
|---|---|---|
| CN | 101133194 A | 2/2008 |
| EP | 0443268 A1 | 8/1991 |
| KR | 10-2006-0071957 A | 6/2006 |
| WO | 2007093082 A1 | 8/2007 |

OTHER PUBLICATIONS

Reitano et al., "Trends in Solute Segregation Behavior During Silicon Solidification", Materials Research Society Symposia Proceedings, 1994, vol. 321, no page numbers.*

(Continued)

*Primary Examiner* — Yelena G Gakh

(57) ABSTRACT

A method and apparatus for forming a sheet are disclosed. A melt is cooled and a sheet is formed on the melt. This sheet has a first thickness. The sheet is then thinned from the first thickness to a second thickness using, for example, a heater or the melt. The cooling may be configured to allow solutes to be trapped in a region of the sheet and this particular sheet may be thinned and the solutes removed. The melt may be, for example, silicon, silicon and germanium, gallium, or gallium nitride.

14 Claims, 6 Drawing Sheets

U.S. PATENT DOCUMENTS

| | | | |
|---|---|---|---|
| 4,599,245 A * | 7/1986 | Falckenberg et al. | 438/62 |
| 4,661,200 A * | 4/1987 | Sachs | 117/24 |
| 4,873,063 A | 10/1989 | Bleil | |
| 5,055,157 A | 10/1991 | Bleil | |
| 5,069,742 A | 12/1991 | Bleil | |
| 5,229,083 A | 7/1993 | Bleil | |
| 5,394,825 A | 3/1995 | Schmid et al. | |
| 6,090,199 A | 7/2000 | Wallace, Jr. et al. | |
| 2006/0102078 A1 | 5/2006 | Fairbairn et al. | |
| 2006/0213589 A1 | 9/2006 | Sawada et al. | |
| 2007/0169684 A1 | 7/2007 | Stoddard | |
| 2007/0190752 A1 | 8/2007 | Faris | |
| 2008/0206967 A1 * | 8/2008 | Miyairi et al. | 438/479 |
| 2009/0231597 A1 | 9/2009 | Rowland et al. | |
| 2009/0233396 A1 | 9/2009 | Kellerman et al. | |

OTHER PUBLICATIONS

D.N. Jewett et al., "Progress in Growth of Silicon Ribbon by a Low Angle, High Rate Process," 16th Photovoltaic Specialists Conference, San Diego, CA, Sep. 27-30, 1982, pp. 86-89, Institute of Electrical and Electronics Engineers, New York, NY, USA.

B. Kudo, "Improvements in the Horizontal Ribbon Growth Technique for Single Crystal Silicon," Journal of Crystal Growth 50, 1980, pp. 247-259, North-Holland Publishing Co., Amsterdam, Netherlands.

Bruce Chalmers, "High Speed Growth of Sheet Crystals," Journal of Crystal Growth 70, 1984, pp. 3-10, North-Holland Publishing Co., Amsterdam, Netherlands.

Paul D. Thomas & Robert A. Brown, "Rate Limits in Silicon Sheet Growth: The Connections Between Vertical and Horizontal Methods," J. of Crystal Growth 82, 1987, pp. 1-9, North-Holland Publishing Co., Amsterdam, Netherlands.

T.F. Ciszek, "Techniques for the Crystal Growth of Silicon Ingots and Ribbons," J. of Crystal Growth 66, 1984, pp. 655-672, North-Holland Publishing Co., Amsterdam, Netherlands.

M.E. Glicksman & P.W. Voorhees, "Analysis of Morphologically Stable Horizontal Ribbon Crystal Growth," J. of Electronic Materials, vol. 12, No. 1, 1983, pp. 161-179, Springer Science+Business Media, Cambridge, MA, USA.

William C. Dash, "Growth of Silicon Crystals Free from Dislocations," J. of App. Phys., vol. 30, No. 4, Apr. 1959, pp. 459-474 American Institute of Physics, Melville, NY, USA.

J.A. Zoutendyk, "Growing Silicon Horizontally," 1982, NASA Tech. Brief, vol. 1, No. 2, Item #58, NPO-14977, pp. 1-10.

* cited by examiner

METHOD OF CONTROLLING A THICKNESS OF A SHEET FORMED FROM A MELT

CROSS-REFERENCE TO RELATED APPLICATIONS

This application claims priority to the provisional patent application entitled "Silicon Sheet Thickness Control," filed Aug. 15, 2008 and assigned U.S. App. No. 61/089,289, the disclosure of which is hereby incorporated by reference.

FIELD

This invention relates to sheet formation from a melt and, more particularly, to reducing the thickness of a sheet formed from a melt.

BACKGROUND

Silicon wafers or sheets may be used in, for example, the integrated circuit or solar cell industry. Demand for solar cells continues to increase as the demand for renewable energy sources increases. There are two types of solar cells: silicon and thin film. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases, one goal of the solar cell industry is to lower the cost/power ratio. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 µm thick. To maintain single crystal growth, the boule must be grown slowly, such as less than 10 µm/s, from a crucible containing a melt. The subsequent sawing process leads to approximately 200 µm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries and this lower quality results in lower efficiency solar cells. The sawing process for a polycrystalline silicon ingot is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 µm.

Horizontal ribbons of silicon that are physically pulled from a melt also have been tested. In one method, a seed attached to a rod is inserted into the melt and the rod and resulting sheet are pulled at a low angle over the edge of the crucible. The angle and surface tension are balanced to prevent the melt from spilling over the crucible. It is difficult, however, to initiate and control such a pulling process. Access must be given to the crucible and melt to insert the seed, which may result in heat loss. Additional heat may be added to the crucible to compensate for this heat loss. This additional heat may cause vertical temperature gradients in the melt that may cause non-laminar fluid flow. Also, a possibly difficult angle of inclination adjustment to balance gravity and surface tension of the meniscus formed at the crucible edge must be performed. Furthermore, since heat is being removed at the separation point of the sheet and melt, there is a sudden change between heat being removed as latent heat and heat being removed as sensible heat. This may cause a large temperature gradient along the ribbon at this separation point and may cause dislocations in the crystal. Dislocations and warping may occur due to these temperature gradients along the sheet.

Production of thin sheets separated horizontally from a melt, such as by using a spillway, has not been performed. Producing sheets horizontally from a melt by separation may be less expensive than silicon sliced from an ingot and may eliminate kerf loss or loss due to squaring. Sheets produced horizontally from a melt by separation also may be less expensive than silicon cleaved from an ingot using hydrogen ions or other pulled silicon ribbon methods. Furthermore, separating a sheet horizontally from a melt may improve the crystal quality of the sheet compared to pulled ribbons. A crystal growth method such as this that can reduce material costs would be a major enabling step to reduce the cost of silicon solar cells. The sheet, however, may be of an incorrect thickness or may have impurities or solutes included within its crystal lattice. Accordingly, there is a need in the art for an improved method of sheet formation from a melt and, more particularly, a method of reducing the thickness of a sheet formed from a melt.

SUMMARY

According to a first aspect of the invention, a method of forming a sheet is provided. The method comprises cooling a melt of a material and forming the sheet of the material in the melt. The sheet has a first thickness. The sheet is thinned from the first thickness to a second thickness. The second thickness is smaller than the first thickness.

According to a second aspect of the invention, an apparatus for forming a sheet is provided. The apparatus comprises a vessel defining a channel configured to hold a melt of a material. A cooling plate is disposed proximate the melt. The cooling plate is configured to form the sheet of the material on the melt. The apparatus also has a radiative heater.

According to a third aspect of the invention, method of forming a sheet is provided. The method comprises cooling a melt of a material in a first stage. The cooling in the first stage has a first parameter. A first layer of the sheet of the material is formed in the melt. The first layer of the sheet has a first thickness and a first solute concentration. The melt is cooled in a second stage. The cooling in the second stage has a second parameter different from the first parameter. The sheet is increased from a first thickness to a second thickness and a second layer of the sheet is formed. The second layer between the first thickness and the second thickness has a second solute concentration higher than the first solute concentration. The sheet is thinned from the second thickness to the first thickness.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
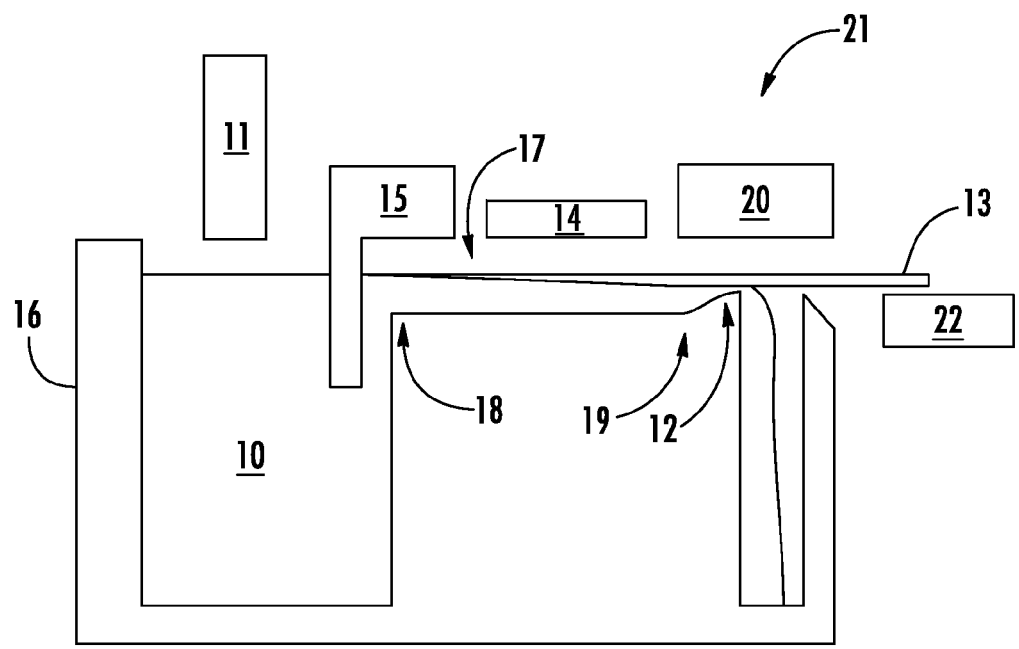
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16 and panels 15 and 20. The vessel 16 and panels 15 and 20 may be, for example, tungsten, boron nitride, aluminum nitride, molybdenum, graphite, silicon carbide, or quartz. The vessel 16 is configured to contain a melt 10. The melt 10 may be silicon. The melt 10 may be replenished through the feed 11 in one embodiment. The feed 11 may contain solid silicon. The melt 10 may be pumped into the vessel 16 in another embodiment. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10. The melt 10 may circulate within the apparatus 21.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, a magnetohydrodynamic drive, a screw pump, an impeller pump, a wheel, or other methods of transport. The melt 10 then flows over the spillway 12. This spillway 12 may be a ramp, a weir, a small dam, or a corner and is not limited to the embodiment illustrated in FIG. 1. The spillway 12 may be any shape that allows a sheet 13 to be separated from the melt 10.

The panel 15 is configured in this particular embodiment to extend in part below the surface of the melt 10. This may prevent waves or ripples from disturbing the sheet 13 as it forms on the melt 10. These waves or ripples may form due to addition of melt material from the feed 11, pumping, or other causes known to those skilled in the art.

In one particular embodiment, the vessel 16 and panels 15 and 20 may be maintained at a temperature slightly above approximately 1687 K. For silicon, 1687 K represents the freezing temperature or interface temperature. By maintaining the temperature of the vessel 16 and panels 15 and 20 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but may include multiple segments or sections in another embodiment. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 and panels 15 and 20 may be any temperature above the melting temperature of the melt 10. This prevents the melt 10 from solidifying on the vessel 16 and panels 15 and 20.

The apparatus 21 may be maintained at a temperature slightly above the freezing temperature of the melt 10 by at least partially or totally enclosing the apparatus 21 within an enclosure. If the enclosure maintains the apparatus 21 at a temperature above the freezing temperature of the melt 10, the need to heat the apparatus 21 may be avoided or reduced and heaters in or around the enclosure may compensate for any heat loss. This enclosure may be isothermal with non-isotropic conductivity. In another particular embodiment, the heaters are not disposed on or in the enclosure and are rather in the apparatus 21. In one instance, different regions of the vessel 16 may be heated to different temperatures by imbedding heaters within the vessel 16 and using multi-zone temperature control.

The enclosure may control the environment where the apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the sheet 13 formation process.

The apparatus 21 includes a cooling plate 14. The cooling plate 14 allows heat extraction as the sheet 13 forms on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. The cooling plate 14 may remove heat from the liquid melt 10 quickly, uniformly, and in controlled amounts. Disturbances to the melt 10 may be reduced while the sheet 13 forms to prevent imperfections in the sheet 13.

The heat extraction of the heat of fusion and heat from the melt 10 over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a large sheet 13 extraction rate.

The dimensions of the cooling plate 14 may be increased, both in length and width. Increasing the length may allow a faster sheet 13 extraction rate for the same vertical growth rate and resulting sheet 13 thickness. Increasing the width of the cooling plate 14 may result in a wider sheet 13. Unlike the vertical sheet pulling method, there is no inherent physical limitation on the width of the sheet 13 produced using embodiments of the apparatus and method described in FIG. 1.

In one particular example, the melt 10 and sheet 13 flow at a rate of approximately 1 cm/s. The cooling plate 14 is approximately 20 cm in length and approximately 25 cm in width. A sheet 13 may be grown to approximately 100 µm in thickness in approximately 20 seconds. Thus, the sheet may grow in thickness at a rate of approximately 5 µm/s. A sheet 13 of approximately 100 µm in thickness may be produced at a rate of approximately 10 m²/hour.

Thermal gradients in the melt 10 may be minimized in one embodiment. This may allow the melt 10 flow to be steady and laminar. It also may allow the sheet 13 to be formed via radiation cooling using the cooling plate 14. A temperature difference of approximately 300 K between the cooling plate 14 and the melt 10 may form the sheet 13 on or in the melt 10 at a rate of approximately 7 µm/s in one particular instance.

The region of the channel 17 downstream from the cooling plate 14 and the under the panel 20 may be isothermal. This isothermal region may allow annealing of the sheet 13.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a single crystal sheet 13 because no external stress is applied to the sheet 13. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions.

The sheet 13 may be formed faster in the apparatus 21 than by being pulled normal to the melt because the melt 10 may flow at a speed configured to allow for proper cooling and crystallization of the sheet 13 on the melt 10. The sheet 13 will flow approximately as fast as the melt 10 flows. This reduces stress on the sheet 13. Pulling a ribbon normal to a melt is limited in speed because of the stresses placed on the ribbon due to the pulling. The sheet 13 in the apparatus 21 may lack any such pulling stresses in one embodiment. This may increase the quality of the sheet 13 and the production speed of the sheet 13.

The sheet 13 may tend to go straight beyond the spillway 12 in one embodiment. This sheet 13 may be supported after going over the spillway 12 in some instances to prevent breakage. A support device 22 is configured to support the sheet 13. The support device 22 may provide a gas pressure differential to support the sheet 13 using, for example, a gas or air blower. After the sheet 13 is separated from the melt 10, the temperature of the environment where the sheet 13 is located may slowly be changed. In one instance, the temperature is lowered as the sheet 13 moves farther from the spillway 12.

In one instance, the growth of the sheet 13, annealing of the sheet 13, and separation of the sheet 13 from the melt 10 using the spillway 12 may take place in an isothermal environment. The separation using the spillway 12 and the approximately equal flow rates of the sheet 13 and melt 10 minimize stress or mechanical strain on the sheet 13. This increases the possibility of producing a single crystal sheet 13.

In another embodiment, a magnetic field is applied to the melt 10 and sheet 13 in the sheet-forming apparatus 21. This may dampen oscillatory flows within the melt 10 and may improve crystallization of the sheet 13.

Figure 2:
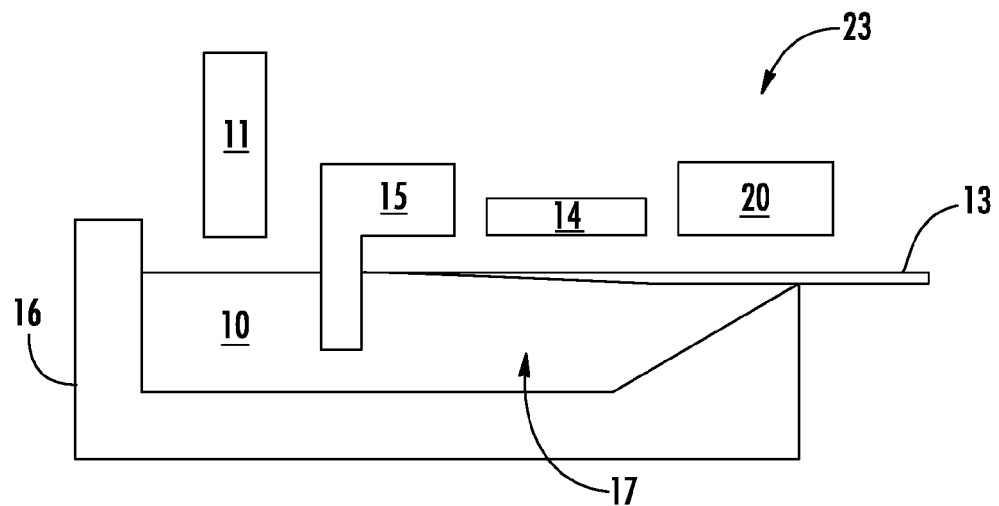
FIG. 2 is a cross-sectional side view of an embodiment of an apparatus that pulls a sheet from a melt.

FIG. 2 is a cross-sectional side view of an embodiment of an apparatus that pulls a sheet from a melt. In this embodiment, the sheet-forming apparatus 23 pulls the sheet 13 from the melt 10. The melt 10 may not be circulating in a channel 17 in this embodiment and the sheet 13 may be pulled using a seed. A sheet 13 may be formed through cooling by the cooling plate 14 and the resulting sheet may be drawn out of the melt 10.

Both the embodiments of FIGS. 1-2 use a cooling plate 14. Different cooling temperatures across the length of the cooling plate 14, different flow rates of the melt 10 or pull speeds of the sheet 13, the length of the various sections of the sheet-forming apparatus 21 or sheet-forming apparatus 23, or the timing within the sheet-forming apparatus 21 or sheet-forming apparatus 23 may be used for process control. If the melt 10 is silicon, a polycrystalline sheet 13 or single crystal sheet 13 may be formed in the sheet-forming apparatus 21. In either the embodiment of FIG. 1 or FIG. 2, the sheet-forming apparatus 21 or sheet-forming apparatus 23 may be contained in an enclosure.

FIG. 1 and FIG. 2 are only two examples of sheet-forming apparatuses that can form sheets 13 from a melt 10. Other apparatuses or methods of vertical or horizontal sheet 13 growth are possible. The embodiments of the methods and apparatuses described herein may be applied to any vertical or horizontal sheet 13 growth method or apparatus and are not limited solely to the specific embodiments of FIGS. 1-2. The sheet 13 formed using the embodiments of FIGS. 1-2 may be too thick or have incorrect dimensions. The sheet 13 also may not have a smooth surface. Thus, the sheet 13 may be thinned to, for example, the correct thickness or to smooth its surface.

Figure 3:
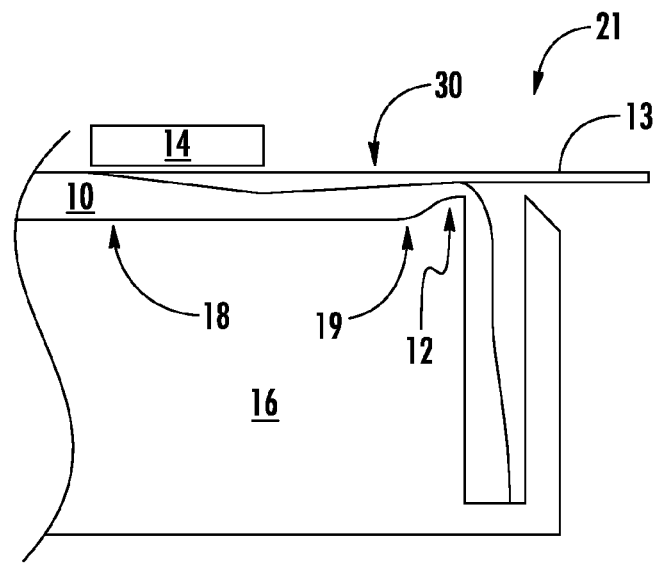
FIG. 3 is a cross-sectional side view of thinning within a melt using the apparatus of FIG. 1.

FIG. 3 is a cross-sectional side view of thinning within a melt using the apparatus of FIG. 1. The melt 10 flows over the spillway 12. The sheet 13 forms in the melt 10 when the melt 10 freezes using the cooling plate 14. The sheet 13 is thinned downstream of the cooling plate 14 but upstream of the spillway 12 in the region 30. This thinning will change the dimensions of the sheet 13 from a first thickness to a second thickness prior to the spillway 12. The heat from the melt 10 will melt at least a portion of the sheet 13 back into the melt 10 as the sheet 13 flows toward the spillway 12.

In one particular instance, the melt 10 or sheet 13 flow speed is approximately 1 µm/s. A laminar flow may be used in this particular embodiment. The temperature of the vessel 16 may be approximately 2 K above the freezing temperature of the sheet 13. The difference between the temperature of the cooling plate 14 and the temperature of the melt 10 may be approximately 300 K. The melt 10 in the region 30 is approximately 1 cm in depth. The rate that the sheet 13 is thinned back to the melt 10 in the region 30 is approximately 1 µm/s. Thus, the thinning rate of the sheet 13 along the direction of the melt 10 or sheet 13 flow between the first point 18 to the second point 19 is approximately 1 µm/cm. The region 30 may have a length of approximately 0.5 m in the direction of the melt 10 or sheet 13 flow to thin the sheet 13 from a thickness of approximately 150 µm to a thickness of approximately 100 µm. This length of the region 30 may be reduced by increasing the temperature of the vessel 16, but this may require the cooling plate 14 to operate at a lower temperature. In another embodiment, the sheet 13 is thinned from a thickness of approximately 200 µm to a thickness of approximately 100 µm.

To have a uniform thinning process, temperature gradients should be sufficiently low to avoid nonuniform or unsteady buoyancy-driven convection to the sheet 13. Unsteady convection is a nonuniform heat flux and, therefore, overall energy transport is difficult to control in a uniform manner. This may lead to a nonuniform thickness in the sheet 13. If the temperature difference in the sheet 13 and the melt 10 is less than approximately 5 K and the depth of the melt 10 in the region 30 is relatively shallow, then buoyancy-driven convection may not cause problems. The depth of the melt 10 in the region 30 may be, for example, less than approximately 1.22 cm or may be approximately 0.97 cm. However, convection in the melt 10 may be acceptable in some embodiments. Other conditions or parameters are possible and this is only one example of a thinning process. This embodiment is not solely limited to the conditions listed in the example above.

Figure 4:
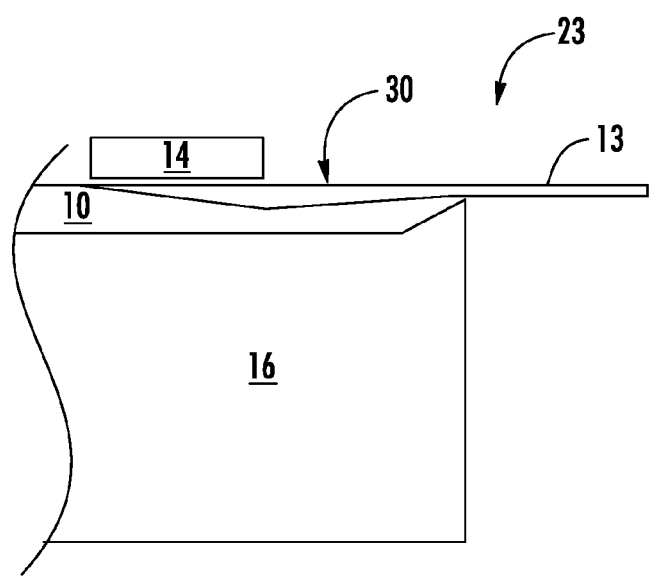
FIG. 4 is a cross-sectional side view of thinning within a melt using the apparatus of FIG. 2.

FIG. 4 is a cross-sectional side view of thinning within a melt using the apparatus of FIG. 2. Thinning a sheet 13 in the region 30 also can be applied to sheet-forming apparatus 23 as well as the sheet-forming apparatus 21 of FIG. 3. Here the sheet 13 is thinned from a first thickness to a second thickness after being formed using the cooling plate 14 and prior to the sheet 13 being pulled from the melt 10.

Figure 5:
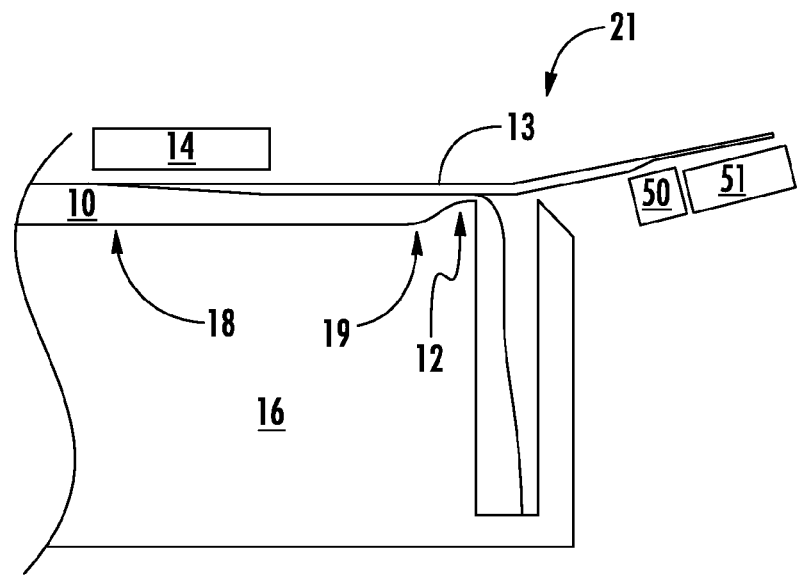
FIG. 5 is a cross-sectional side view of thinning with a heater using the apparatus of FIG. 1.

FIG. 5 is a cross-sectional side view of thinning with a heater using the apparatus of FIG. 1. The sheet-forming apparatus 21 includes a heater 50 and a fluid bearing 51. Both the heater 50 and fluid bearing 51 are inclined with respect to the formation of the sheet 13 on the melt 10 in this particular embodiment. The sheet 13 flows from a first point 18 to a second point 19 and over the spillway 12. After the sheet 13 goes over the spillway 12, the sheet 13 is thinned using the heater 50. The sheet 13 is thinned from a first thickness to a second thickness. For example, the sheet 13 may be thinned from approximately 200 µm to approximately 100 µm.

Separating the forming of the sheet 13 with the cooling plate 14 and the thinning the sheet 13 with the heater 50 may allow freezing of the sheet 13 with small temperature gradients. Any portion of the sheet 13 that is melted from the sheet 13 using the heater 50 may flow back along the sheet 13 and into the melt 10 or may drip into a collection device. This is at least partly due to the angle of the sheet 13. The portion of the sheet 13 that is melted from the sheet 13 may be solute-rich in one specific embodiment.

In this particular embodiment, the heater 50 is a radiative heater. Other heaters or a radiative heater with a convective component also may be used. The heater 50 may allow uniform thinning of the sheet 13 and may only supply the latent heat of melting without altering the temperature of other parts of the sheet-forming apparatus 21.

The fluid bearing 51 inclines the sheet 13 at an angle in this particular embodiment. The angle may be shallow to prevent stress to the sheet 13. While a fluid bearing 51 is illustrated, an air bearing, roller, or another sheet 13 movement mechanism may be used. In another embodiment, the sheet 13 remains level and the fluid bearing 51 does not incline the sheet 13 at an angle. Any melted portion of the sheet 13 in this instance drips off.

While this embodiment is illustrated having a distance between the cooling plate 14 and the spillway 12, this distance can be minimized. For example, the cooling plate 14 may be placed in close proximity to the spillway 12. Rather than allowing the melt 10 to thin the sheet 13 after formation, the heater 50 can predominantly thin the sheet 13. In another embodiment, though, the heater 50 works in conjunction with the melt 10 to thin the sheet 13.

Figure 6:
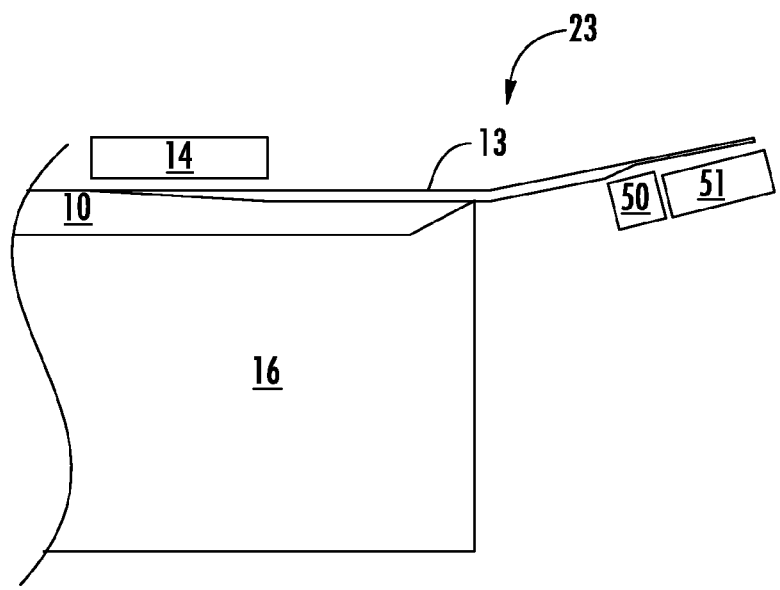
FIG. 6 is a cross-sectional side view of thinning with a heater using the apparatus of FIG. 2.

FIG. 6 is a cross-sectional side view of thinning with a heater using the apparatus of FIG. 2. Thinning a sheet 13 with a heater 50 also can be applied to sheet-forming apparatus 23 as well as the sheet-forming apparatus 21 of FIG. 5. Here the sheet 13 is thinned from a first thickness to a second thickness after being formed using the cooling plate 14 and after the sheet 13 is pulled from the melt 10.

In another embodiment, the sheet 13 is thinned and the melt 10 is purified or has a solute level reduced. This is related to the segregation coefficient of the solutes, which provides the relationship between the concentration of impurity atoms (solutes) in the growing crystal sheet 13 and the melt 10. Many solutes have a segregation coefficient of less than one, which results in a solid sheet 13 with a lower concentration of solutes than the liquid melt 10. Thus, as the sheet 13 forms, the solute concentration in the melt 10 increases because the solutes preferentially stay in the melt 10. This may cause constitutional instabilities during the crystallization process of the sheet 13 and may result in a poor-quality sheet 13 or a sheet 13 with dendrites, or branching projections, on its surfaces.

Figure 7:
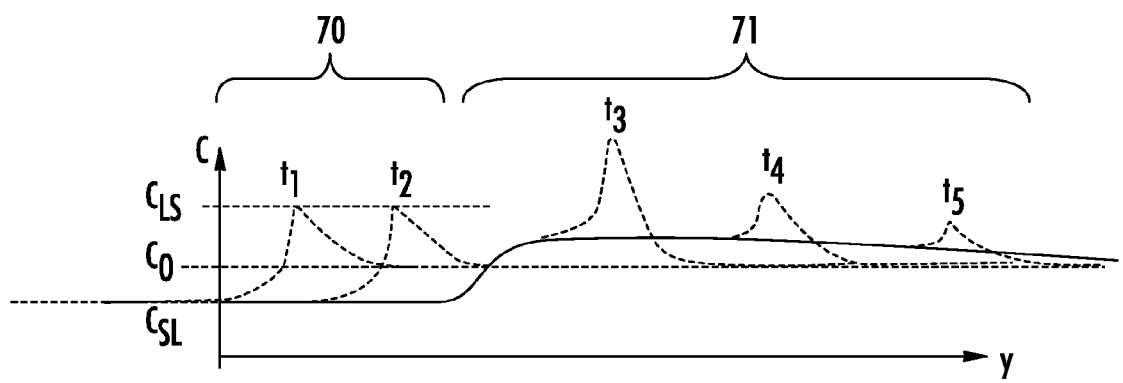
FIG. 7 represents a concentration profile over time in the melt and solid near the sheet-melt interface.

In this particular embodiment, purification of the melt 10 is accomplished during the sheet 13 formation and thinning process. This purification may allow the use of a less pure melt 10 feedstock or less melt 10 feedstock overall because the melt 10 is purified while the sheet 13 is formed. FIG. 7 represents a concentration profile over time in the melt and solid near the sheet-melt interface. Solute segregation is dependent in part on the freezing process of the sheet 13 being performed slowly enough for the solutes to diffuse in the melt 10. However, if crystallization of the sheet 13 is performed quickly, then the segregated solute has no time to diffuse into the melt 10. Thus, the solutes can be captured in the solid sheet 13.

As seen in FIG. 7, the sheet 13 may be formed in at least two stages. In this particular embodiment, the stages are labeled as stage 70 and stage 71. The stage 70 may be referred to as "slow" and the stage 71 may be referred to as "fast." The growth of the sheet 13 in the stage 70 occurs slower than the stage 71 or at, for example, a normal speed to produce a purified or high-quality crystal sheet 13. The stage 70 may grow the sheet 13 at a rate of between approximately 5 μm/s and approximately 10 μm/s in one example. The growth of the sheet 13 in the stage 71 occurs faster than the stage 70 to capture solutes rejected in the stage 70. The stage 71 may be configured to prevent stress to the sheet 13. This may require the stages 70, 71 to be different lengths or to operate at different temperatures. For example, the temperature at in the stage 70 may operate at approximately 100 K below the crystallization temperature of the sheet 13 and the stage 71 may operate at approximately 500 K below the crystallization temperature of the sheet 13.

In FIG. 7, the crystallization is occurring slowly at $t_1$ and $t_2$, which allows the segregated solute in the liquid melt 10 to diffuse away. At $t_3$ the crystallization occurs rapidly enough that the high concentration edge gets captured in the formed crystal sheet 13, thus raising the solute concentration in the crystal sheet 13. At $t_4$ and $t_5$ the solute level decreases in the melt 10 because it was captured in the crystal sheet 13. This may be represented by the formulas:

$$k = C_{SL}/C_{LS}$$

$$k_{eff} = C_0/C_{LS}$$

wherein k represents the equilibrium segregation coefficient, which equals $C_{SL}$ divided by $C_{LS}$. $k_{eff}$ is a nonequilibrium segregation coefficient due to movement of the interface and $C_0$ is the concentration away from the freezing edge. $k_{eff}$ takes into account the higher concentration near the freezing edge of the sheet 13. $k_{eff}$ approaches k as interface velocity approaches zero. At the solid-liquid interface, $C_{SL}$ is the concentration of the solute in solid and $C_{LS}$ is the concentration of the solute in liquid. The flow of the sheet 13 or melt 10 is represented by y.

In this instance, the first 50 μm of the sheet 13 is formed during the stage 70. This allows an effective segregation coefficient of less than 1, meaning that the diffusion of the solute, such as iron, in the liquid melt 10 is faster than the freeze velocity. The next 150 μm of the sheet 13 is formed during the stage 71. A high concentration layer of solutes is captured in the sheet 13. To avoid an increase of solute concentration in the melt 10, this captured layer is melted off the sheet 13 after the sheet goes over a spillway 12 in one embodiment. In another instance, the stage 70 forms a sheet 13 with a first thickness of 100 μm and the stage 71 adds another 100 μm thickness to the sheet 13 to form a second thickness of 200 μm. Other thicknesses also are possible.

Figure 8:
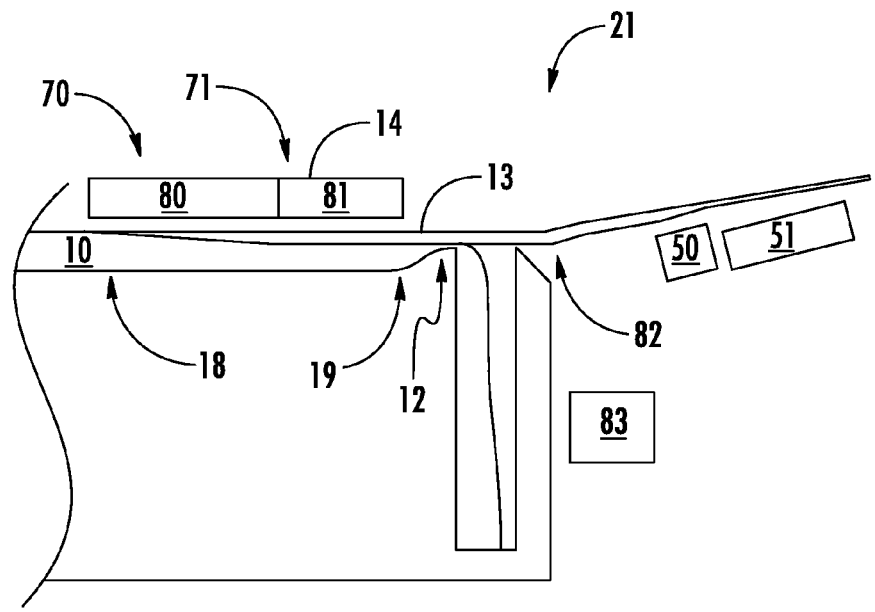
FIG. 8 is a cross-sectional side view of thinning and purification using the apparatus of FIG. 1.

Using the stages 70, 71 followed by thinning can remove the solute-rich layer that forms on the sheet 13 during the stage 71. FIG. 8 is a cross-sectional side view of thinning and purification using the apparatus of FIG. 1. The cooling plate 14 has at least two segments: first segment 80 and second segment 81. The first segment 80 and second segment 81 correspond to the stages 70, 71. As seen in FIG. 8, the first segment 80 and second segment 81 are different lengths with respect to the flow of the sheet 13 and melt 10. In another instance, the first segment 80 and second segment 81 operate at different temperatures. The sheet 13 flows from a first point 18 to a second point 19 and over the spillway 12.

After the sheet 13 goes over the spillway 12, the sheet 13 is thinned using the heater 50. The sheet 13 is thinned from a first thickness to a second thickness. The heater 50 may be, for example, a radiative heater. Other heaters or a radiative heater with a convective component also may be used. The heater 50 may allow uniform thinning of the sheet 13 and may only supply the latent heat of melting without altering the temperature of other parts of the sheet-forming apparatus 21.

The fluid bearing 51 inclines the sheet 13 at an angle in this particular embodiment. The angle may be shallow to prevent stress to the sheet 13. The sheet 13 is angled by the fluid bearing 51 so that the angle 82 is external the melt 10. While a fluid bearing 51 is illustrated, an air bearing, roller, or another sheet 13 movement mechanism may be used. In another embodiment, the sheet 13 remains level and the fluid bearing 51 does not incline the sheet 13 at an angle. Any melted portion of the sheet 13 in this instance drips off.

Any of the sheet 13 that is thinned and melted from the sheet 13 by the heater 50 will flow back along the sheet 13 to the angle 82. There this melted sheet 13, or waste melt, will drip into, for example, a bilge 83. This collects and separates the melted sheet 13 and prevents the melted sheet 13 from returning to the melt 10. This bilge 83 may be connected to a melt 10 circulation or purification system. In one embodiment, the contents of the bilge 83 are purified and this purified melt 10 is recycled back to the melt 10. This prevents the solute-rich bilge 83 contents from contaminating the melt 10. This thinning of the sheet 13 combined with purification will remove solutes, maintain a high-purity melt 10, and maintain a high-efficiency of melt 10 feedstock while lowering melt 10 waste.

In one example, the apparatus of FIG. 8 will take a sheet 13 formed by the cooling plate 14 with a thickness greater than 200 μm and thin it to a thickness of 100 μm or less. The removed or thinned portion of the sheet 13 may be returned to the melt 10 to avoid material losses or the equivalent to "kerf loss." The thinning method of FIG. 8 also may smooth any protuberances on the surface of the sheet 13 besides removing impurities or solutes from the sheet 13.

Figure 9:
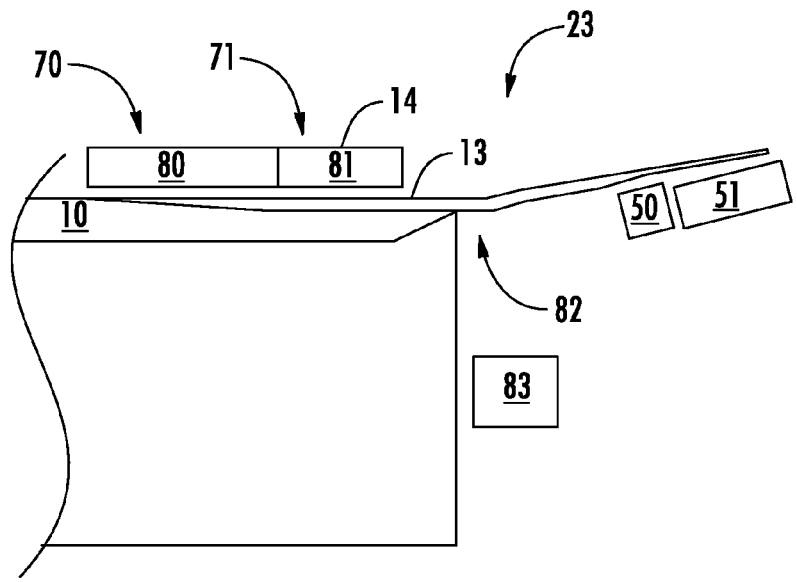
FIG. 9 is a cross-sectional side view of thinning and purification using the apparatus of FIG. 2.

FIG. 9 is a cross-sectional side view of thinning and purification using the apparatus of FIG. 2. Use of a cooling plate with a first segment 80 and second segment 81 and thinning a sheet 13 with a heater 50 also can be applied to sheet-forming apparatus 23 as well as the sheet-forming apparatus 21 of FIG. 8. Here the sheet 13 is thinned from a first thickness to a second thickness after being formed using the cooling plate 14 and after the sheet 13 is pulled from the melt 10.

Figure 10:
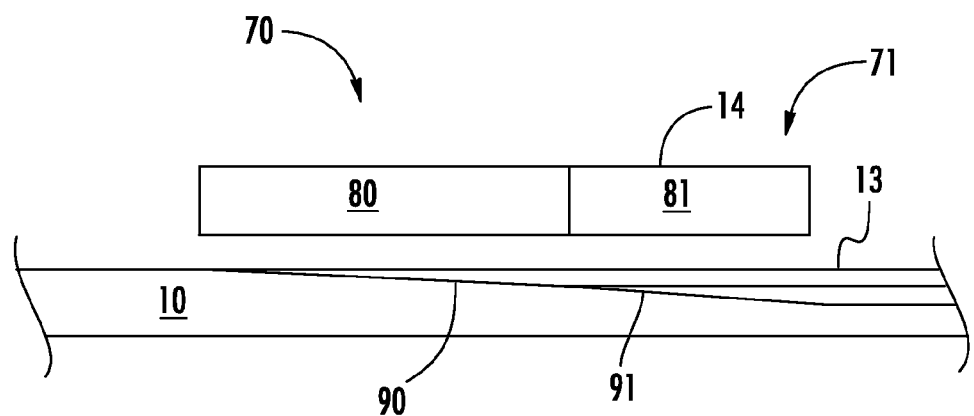
FIG. 10 is a cross-sectional side view of capturing impurities during sheet growth.

FIG. 10 is a cross-sectional side view of capturing impurities during sheet growth. This is a close-up view better illustrating the process involved in FIGS. 7-9. The cooling plate 14 has a first segment 80 and a second segment 81 that correspond to the stages 70 and 71. The sheet 13 formed will have a first layer 90 and a second layer 91. In one example, the first layer 90 corresponds to a first thickness and the second layer 91 with the first layer 90 combined correspond to a second thickness. The first layer 90 is primarily formed using the first segment 80 and has a relatively low solute concentration. The second layer 91 is primarily formed using the second segment 81 and has a higher solute concentration compared to the first layer 90. Much of the solute rejected from the sheet 13 during formation by the first segment 80 could be captured during sheet 13 formation by the second segment 81 because the boundary layer may be thin. Thus, the second layer 91 may capture the solutes and impurities. In one instance, the solute concentration in the first layer 90 may be approximately $10^{-10}$ atoms/cc and the concentration of solutes in the second layer 91 may be approximately $10^8$ atoms/cc. The second layer 91 is removed or thinned using the heater 50 of FIGS. 8-9. The first segment 80 and second segment 81 have different operating parameters, such as lengths or temperatures.

A horizontal sheet 13 growth method may benefit from the thinning methods illustrated in FIGS. 3-10 for an additional reason. Some data suggest that there may be a limit to how thin a sheet 13 may be produced horizontally. If it is pulled or grown too thin, the sheet 13 may "cut" off or break apart. This may be due to instability in the melt 10 or the sheet 13. Another suggestion is that this may be caused by the high surface tension and low viscosity of the melt 10. Thus, it is possible that the melt 10 may be prone to the Marangoni effect. The Marangoni effect is mass transfer along an interface due to surface tension. A liquid with a high surface tension will pull more strongly on the surrounding liquid than a liquid with a low surface tension. The presence of a gradient in surface tension will cause the liquid to flow away from regions with low surface tension. Mass transfer on or in the liquid may occur due to these surface tension differences. A thicker sheet 13 may be more stable or less prone to breakage or being "cut" off. By growing a sheet 13 with a thickness of approximately 200 µm or more and then thinning the sheet 13 to a thickness of approximately 100 µm or less, the Marangoni effect or other growth problems may be avoided. If the thinned portion of the sheet 13 is returned to the melt 10, there is no loss of material.

The methods and apparatuses for thinning illustrated in FIGS. 3-10 may be combined together or used separately. Additionally, other thicknesses of the sheet 13 are possible than those listed in the embodiments disclosed herein.

The thinning illustrated in FIGS. 3-10 may be controlled by altering parameters. These parameters may be, for example, the temperature of the cooling plate 14, the temperature of the melt 10, the operating temperature of the heater 50, the temperature of the vessel 16, or the flow or pull speed of the sheet 13 or melt 10. The parameters may be altered by a controller in response to signals from measurement devices.

Figure 11:
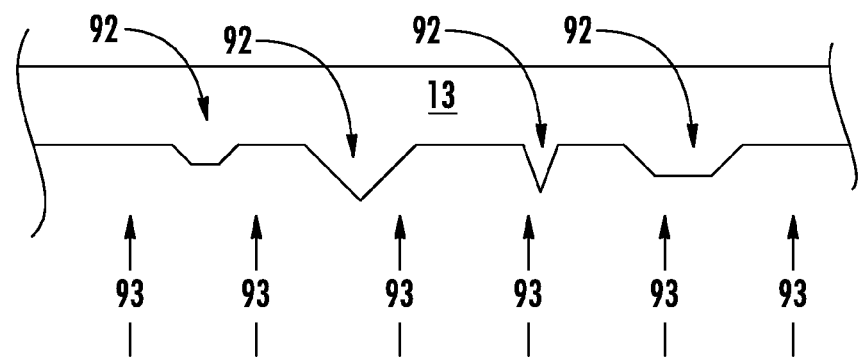
FIG. 11 is a cross-sectional view of heating a sheet.

FIG. 11 is a cross-sectional view of heating a sheet. In the embodiments disclosed herein, smoothing of a sheet 13 may occur using, for example, a heater 50 or the heat from the melt 10 that melts the sheet 13. The local absorbed heat is proportional to the local surface area of the sheet 13, thereby preferentially melting protuberances, dendrites, or other irregularities 92 that form on the surface of the sheet 13. Thus, the heat flux 93, which may be from the melt 10 or radiation, melts the protuberances, dendrites, or other irregularities 92 prior to the rest of the sheet 13. Thus, thinning the sheet 13 will form a smoother sheet 13 with smaller or no protuberances, dendrites, or other irregularities 92. The uniformity of the surface of the sheet 13 may be relative to the size of the protuberances, dendrites, or other irregularities 92.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a sheet from a material comprising at least one of silicon, germanium, or gallium, comprising:
   heating said material to form a melt;
   introducing said melt into a channel in a vessel configured to contain said melt;
   forming a sheet of said material on a surface of said melt by controllably cooling said melt in a first region of said channel, said sheet having a first thickness after said forming;
   horizontally transporting said sheet to a second region of said channel downstream of said first region with said sheet floating on said surface of said melt, wherein a temperature of said melt and a speed of said transporting are controlled;
   thinning said sheet from said first thickness to a second thickness while said sheet is on said surface of said melt in said second region, wherein said second thickness is smaller than said first thickness and wherein said thinning occurs after said forming by controllably heating said melt;
   and
   separating said sheet from said melt after said thinning.

2. The method of claim 1, further comprising smoothing a surface of said sheet during said thinning using a heat flux from said melt.

3. The method of claim 1, wherein said first thickness is between 50 µm and 100 µm and said second thickness is between 150 µm and 200 µm.

4. The method of claim 2, wherein said thinning occurs at a rate of at least 1 µm/s.

5. The method of claim 3, wherein said first thickness is 200 µm and said second thickness is 100 µm.

6. The method of claim 1, wherein said controllable cooling comprises controllable radiative cooling.

7. The method of claim 6, wherein said controllable radiative cooling comprises using a cooling plate.

8. The method of claim 7, wherein said controllable radiative cooling comprises controlling a temperature of said cooling plate to affect said first thickness.

9. The method of claim 7, wherein a temperature of said cooling plate is different from said temperature of said melt by 300 K.

10. The method of claim 1, wherein said controlling said temperature of said melt comprises at least one of controlling a temperature of a heater used for said controllable heating or controlling a temperature of said vessel containing said melt.

11. The method of claim 1, wherein controlling said speed of said transporting is to affect at least one of said first thickness or said second thickness of said sheet.

12. The method of claim 1, wherein a temperature of said vessel is 2 K higher than a freezing temperature of said melt.

13. The method of claim 1, wherein said separating comprises using a spillway.

14. The method of claim 1, wherein said separating comprises pulling said sheet from said melt using a seed.

* * * * *